(12) United States Patent
Fujii et al.

(10) Patent No.: US 6,735,092 B2
(45) Date of Patent: May 11, 2004

(54) EXPANSION BOARD APPARATUS

(75) Inventors: Kazuo Fujii, Yokohama (JP); Yoshihisa Ishihara, Yamato (JP); Aaron M. Stewart, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/154,115

(22) Filed: May 23, 2002

(65) Prior Publication Data

US 2003/0063451 A1 Apr. 3, 2003

(30) Foreign Application Priority Data

Jul. 13, 2001 (JP) .................................... 2001-214379

(51) Int. Cl.$^7$ ................................................. H05K 7/12
(52) U.S. Cl. ................... 361/810; 361/720; 361/760; 361/825
(58) Field of Search .......................... 361/810, 760, 361/720, 748, 825, 736, 721

(56) References Cited

U.S. PATENT DOCUMENTS

| | | | | | |
|---|---|---|---|---|---|
| 4,840,570 | A | * | 6/1989 | Mann et al. | 439/74 |
| 5,162,675 | A | * | 11/1992 | Olsen et al. | 326/37 |
| 6,567,271 | B2 | * | 5/2003 | Stone et al. | 361/724 |
| 6,614,662 | B2 | * | 9/2003 | Stickler et al. | 361/777 |

\* cited by examiner

*Primary Examiner*—David Martin
*Assistant Examiner*—Hung Bui
(74) *Attorney, Agent, or Firm*—J. Bruce Schelkopf

(57) ABSTRACT

In part, and in addition to apparatus and methods presented, an expansion board to be connected/disconnected to/from its mother board easily is provided. A face of a CDC (Communication Daughter Card), which is an expansion board to be connected to the mother board of a computer system is covered by an insulating sheet. In the CDC, an edge of one end of this insulating sheet is extended so as to form a projection. A user can take this projection with fingers, thereby carrying and connecting/disconnecting the CDC to/from the mother board easily.

6 Claims, 10 Drawing Sheets

[Figure 1]
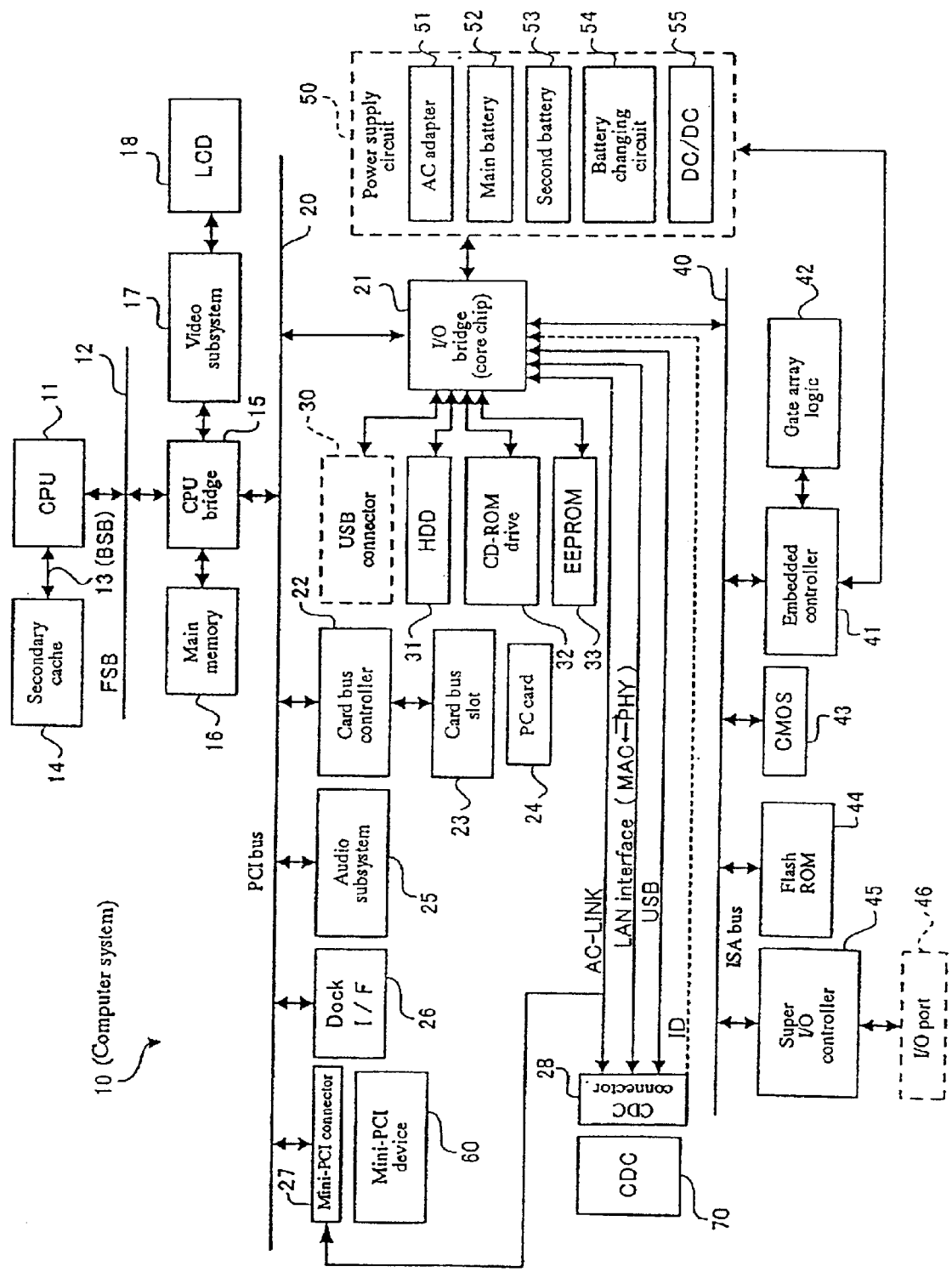

[Figure 2]
(A)
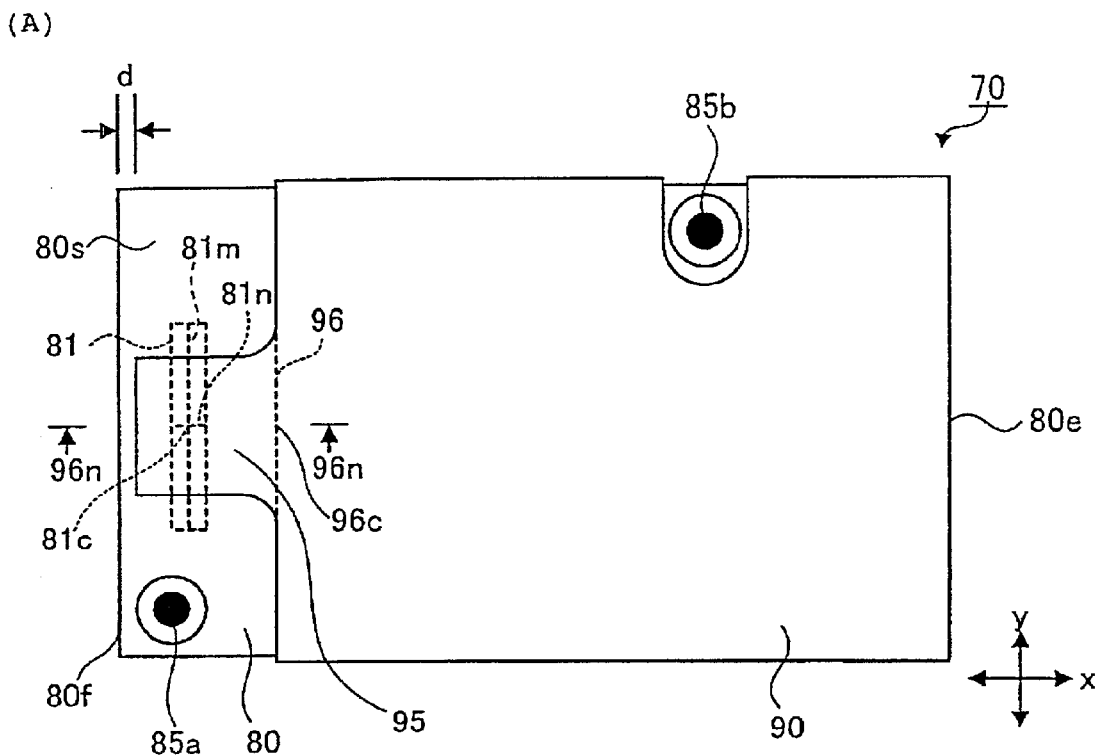
(B)
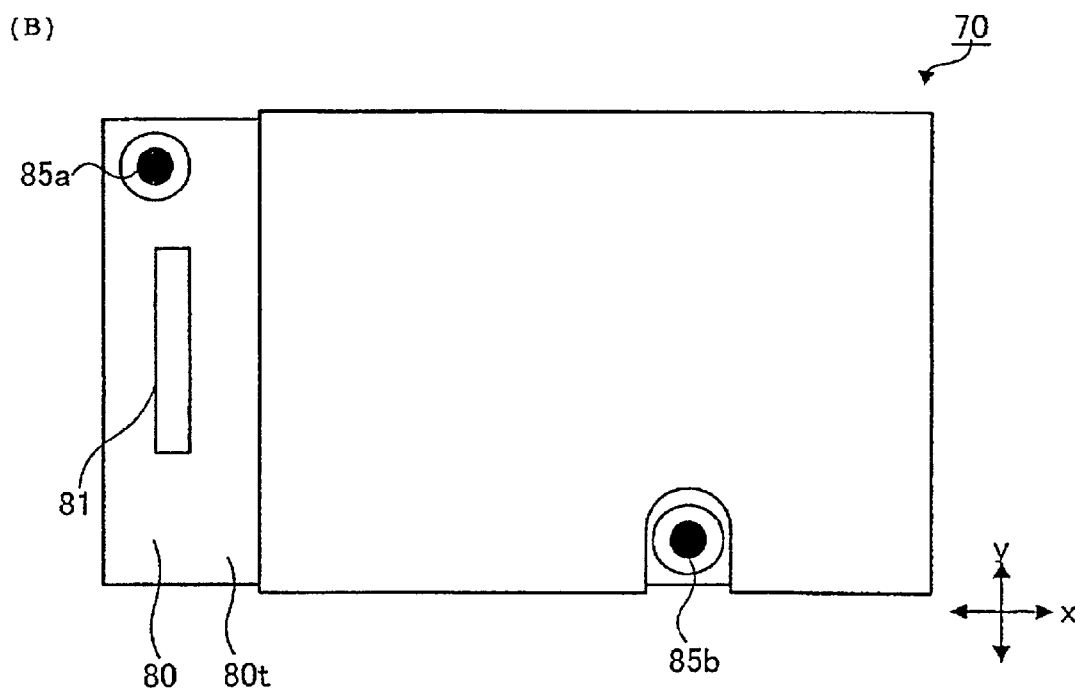

[Figure 3]
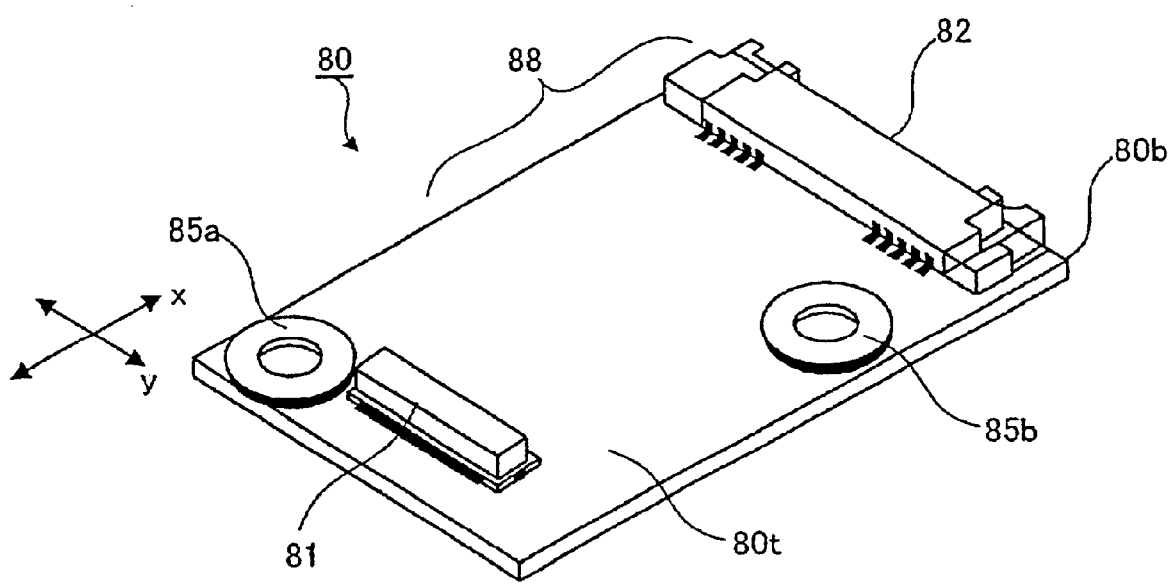

[Figure 4]
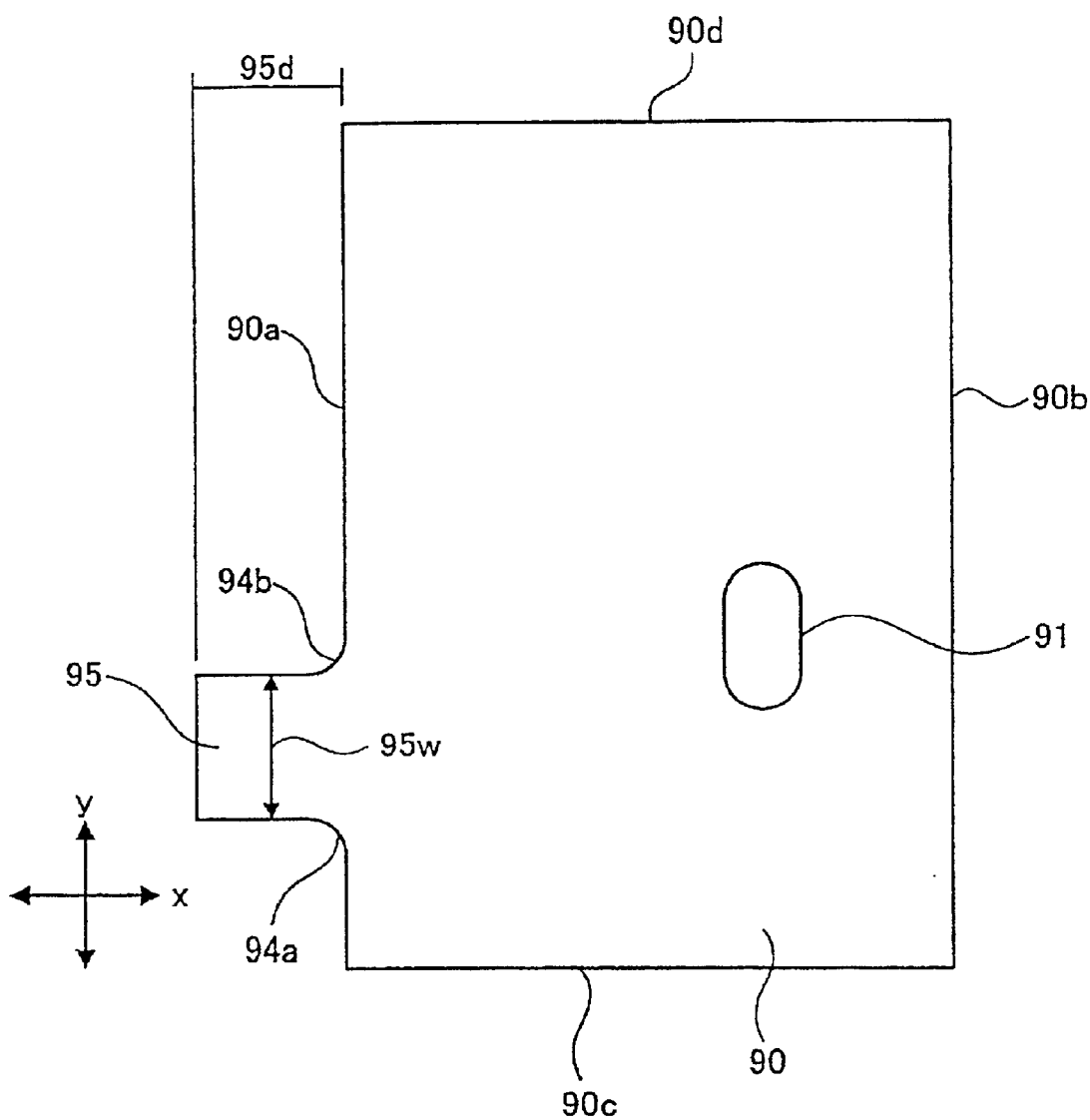

[Figure 5]
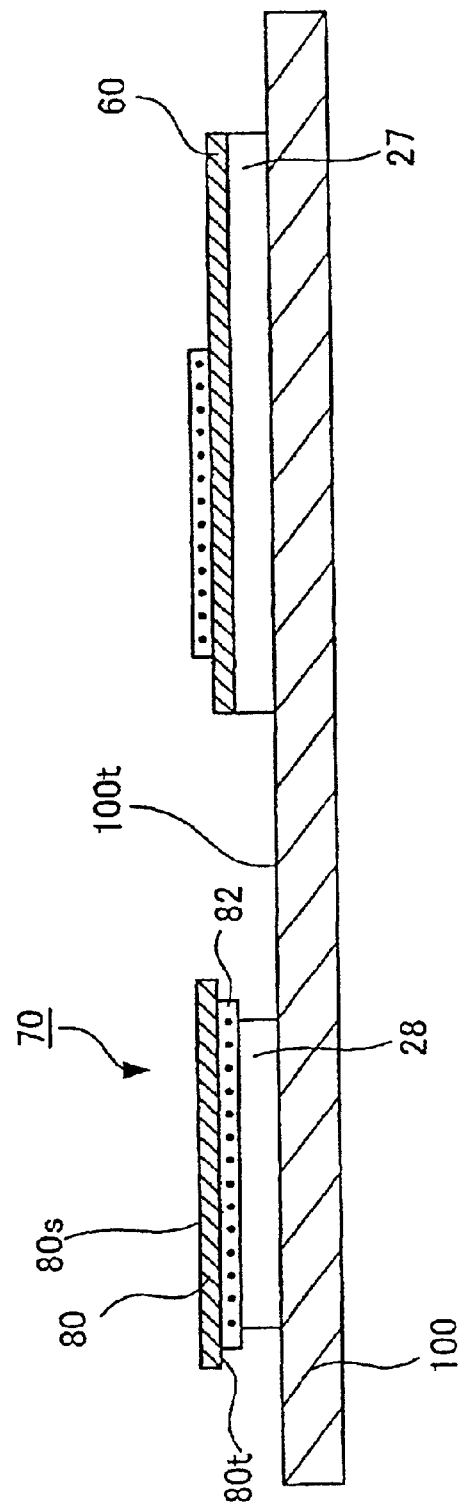

[Figure 6]
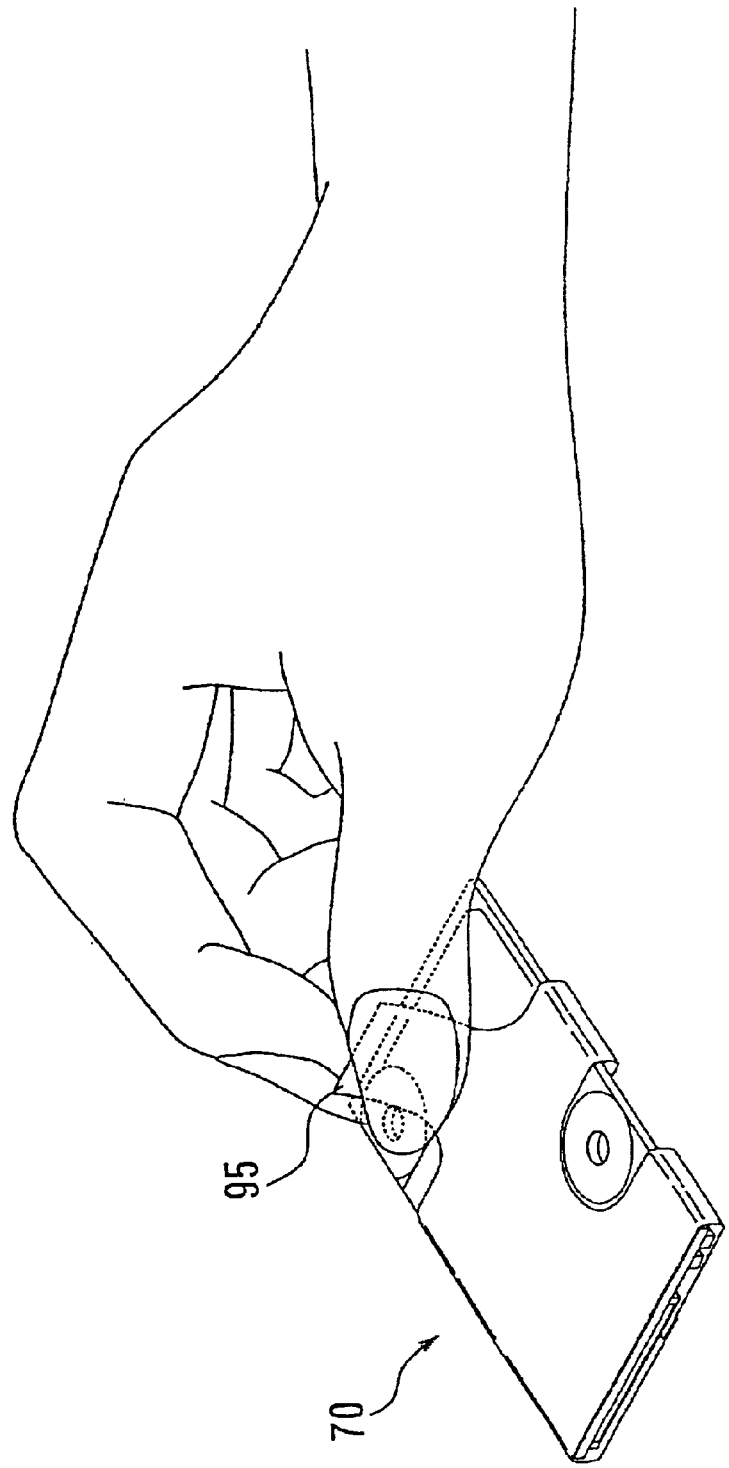

[Figure 7]
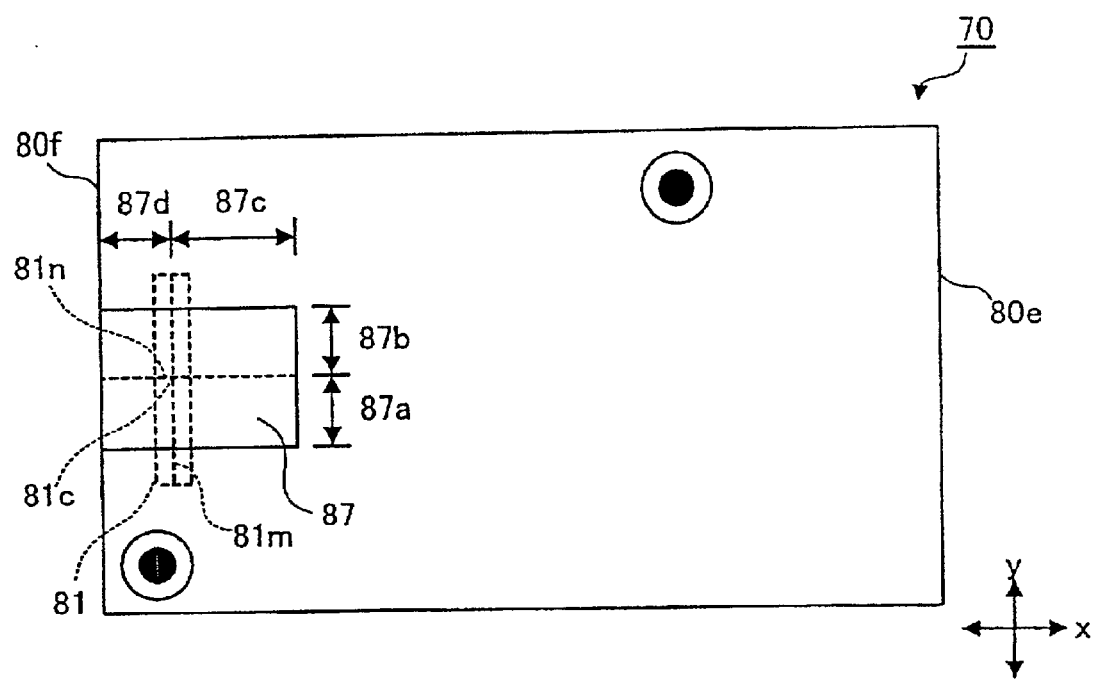

[Figure 8]
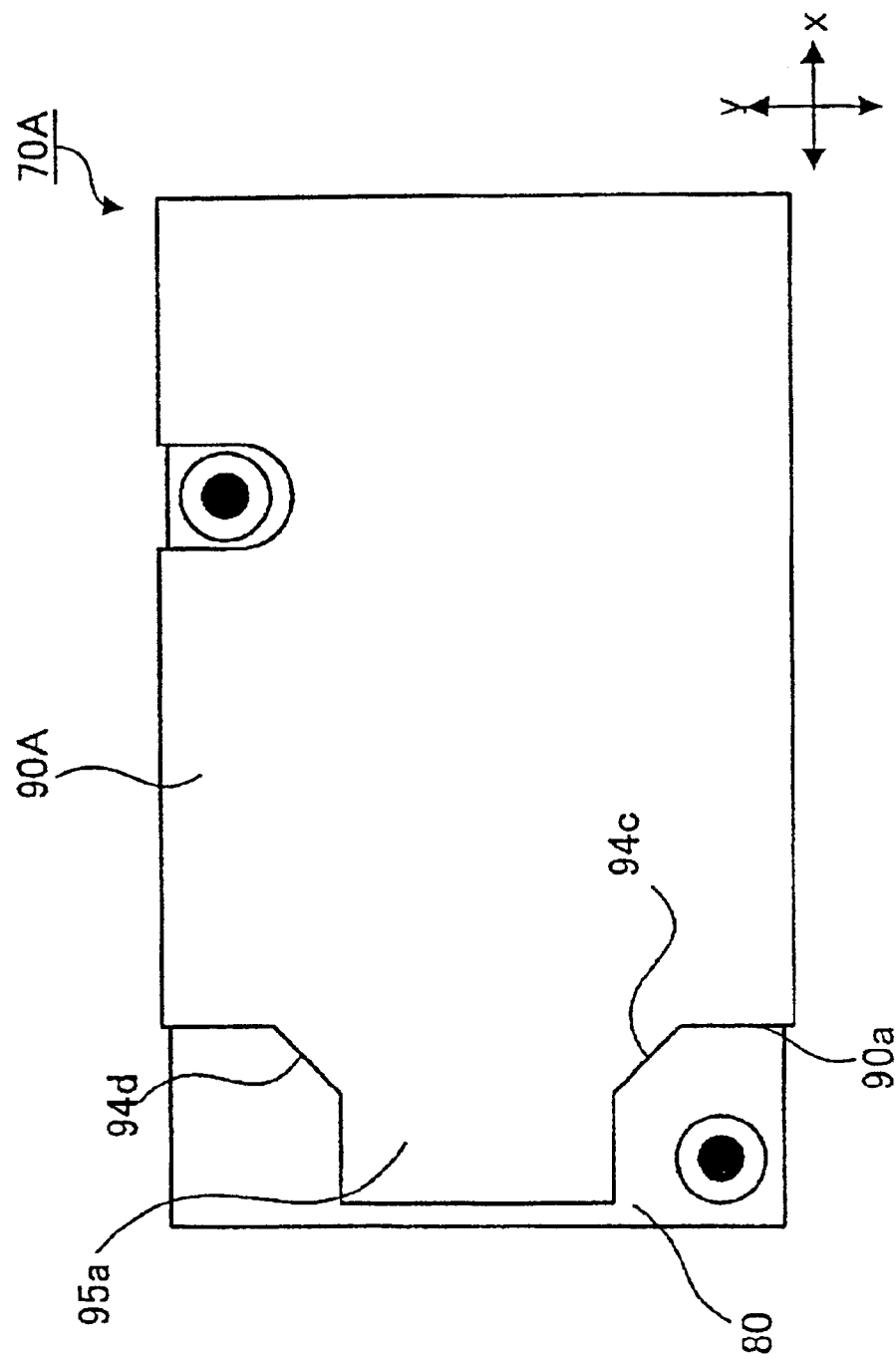

[Figure 9]
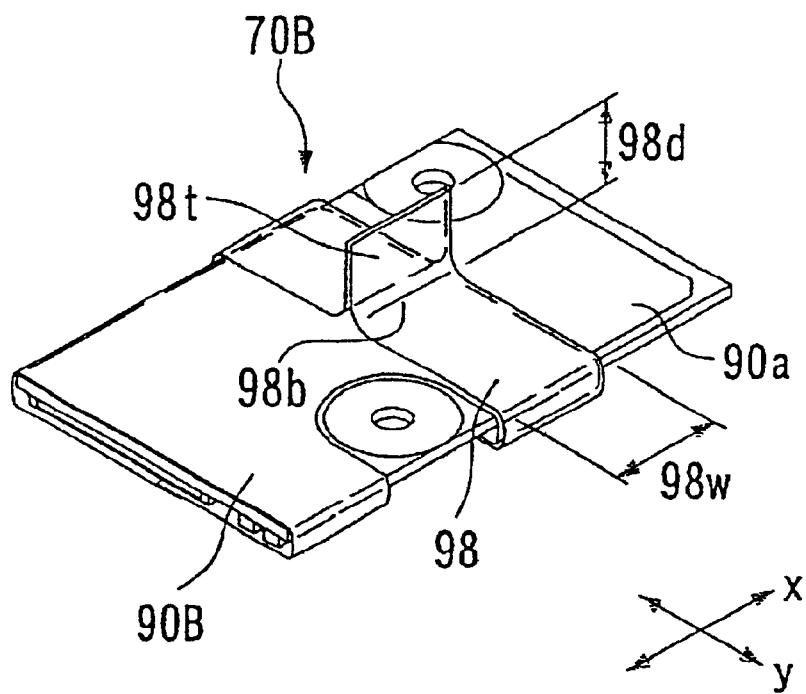

[Figure 10]
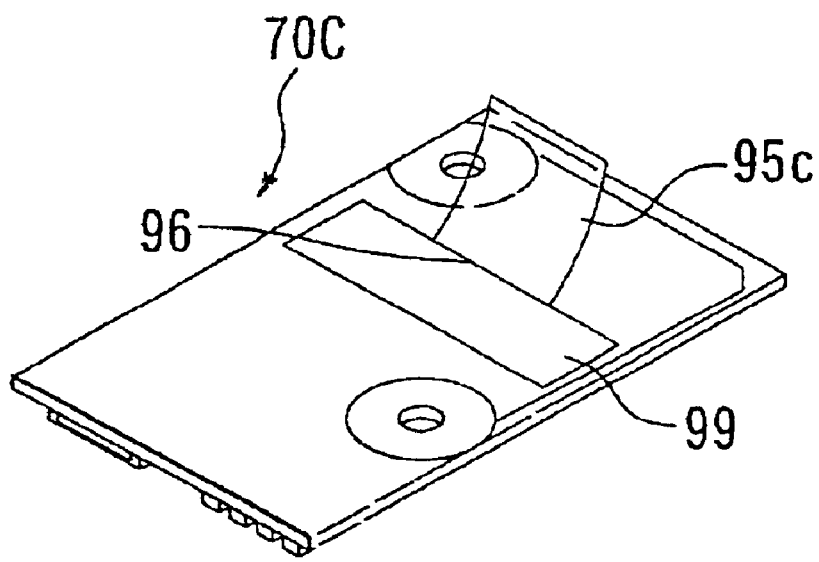

EXPANSION BOARD APPARATUS

BACKGROUND OF THE INVENTION

1. Field of the Invention

The present invention relates to an expansion board, expansion board for communication, insulating film for expansion board, computer system, expansion board removing method, and electronic circuit board, and more particular to apparatus and method for such to be employed with computer systems.

2. Description of Related Art

In recent years, so-called PCs (personal computers) have come to be provided with more and more diversified functions. For example, many of those PCs are provided with functions for communicating with external just by connecting such an expansion device as a modem board, a LAN board, etc. to them. Those expansion devices are classified into two types; built-in type and external type. The built-in type device is installed inside the subject PC while the external type device is connected to the subject PC from outside. Users often select and install necessary expansion devices by themselves according to their requirement. For a built-in type device, the user is required to expose the PC by removing the case and connect the board type expansion device to the connector of the mother board inside the PC.

However, some expansion devices cannot be installed by users. Concretely, those devices are small expansion devices for lap-top PCs. Because portability is an very important item for lap-top PCs, those expansion devices are limited in size. Consequently, parts are packed at a high density thereon, so that the lap-top PCs become complicated in internal structure. In addition, expansion devices must be installed/removed very accurately and carefully. This is why usually the PC makers install those small expansion devices in lap-top PCs; no consideration is given to the installation of those devices by users from the beginning.

In spite of this, year after year there have increased users who want to expand the capability of their lap-top PCs more freely and accordingly, those users come to desire to install those small expansion devices by themselves. It would therefore be a significant advantage for those users if they could install/remove those expansion devices that are comparatively expensive small expansion devices and mother boards etc. by themselves.

SUMMARY OF THE INVENTION

Under such circumstances, it is an object of the present invention to solve the above conventional technical problems and provide an expansion board, which enables users to connect/disconnect expansion devices to/from mother boards of those lap-top PCs.

In order to attain the above object, in one aspect, the expansion board of the present invention, connected to the mother board of the subject computer system, is intended to expand the functions of the computer system. The expansion board of the present invention comprises a first face facing the mother board; a second face that is the back of the first surface; and a projection formed by a flexible sheet extended from the second face so as to be separated therefrom. The user can connect/disconnect the small expansion board to/from a predetermined position inside the subject PC smoothly by taking this protruded sheet with fingers. The shape of the flexible sheet is not limited specially; it is just required for the user to be able to take it with fingers. For example, the flexible sheet may be a narrow strap-like one.

Furthermore, in another aspect, the expansion board of the present invention to be employed for computer systems includes two surfaces; face and back. On the back is provided a connector used to connect the mother board of the subject computer system and on the face is provided a grip used to take the expansion board with fingers.

The present invention, in a further aspect, may also be considered as a communication expansion board. In this case, the communication expansion board comprises a board provided with a primary area used to connect an external network and a secondary area used to connect a portion inside the subject computer, an insulating film used to cover at least the primary area, and a projection provided with a fixed end fixed to the face of the insulating film and a free end formed so as to be separated from the insulating film.

The projection may be formed by extending the insulating film. In such a case, the insulating film is wound on the communication expansion board in the width direction and the projection is extended in the longitudinal direction of the board so as to cross the width direction. The projection may also be formed by a dedicated sheet separately from the insulating film. In such a case, the fixed end of the projection may be formed by connecting one end of the dedicated projection sheet to the insulating film. The projection may also be formed by winding the dedicated projection sheet on the communication expansion board, then connecting both ends of the sheet to each other.

The present invention in still a further aspect may also be considered as an insulating film for the communication expansion board. The insulating film used for the communication expansion board includes a cover portion used to cover the face of the communication expansion board and a projection extended from the fixed end on the face of the cover portion to external and enabled to be taken with fingers.

Furthermore in another aspect, the present invention may be considered as a computer system. The computer system comprises accepting means for accepting an expansion board removably; processing means for processing data of the expansion board connected to the accepting means; board holding means located on the face of the expansion board and enabled to be held by the user so as to connect/disconnect the board to/from the accepting means. This board holding means is preferably configured so that the user can remove the board from the accepting means easily.

The computer system of the present invention also includes a mother board and an expansion board connected to the mother board. The mother board includes processing means and an expansion board connector used to connect the board and send/receive data to/from the processing means. The expansion board includes a mother board connector used to connect the mother board and an extended sheet extended from the face of the expansion board.

In the computer system, the communication channel used for the communication with an external network is extended from the processing device and connected to the expansion board connector. The communication channel may include one of a modem channel, a LAN channel, and a wireless LAN channel.

Furthermore in another aspect, the present invention may also be considered as a method for disconnecting the expansion board from the mother board connector. According to the method, the user takes grip of the expansion board with fingers and pulls it so as to disconnect and remove the board from the mother board connector connected to the back of the board.

Further, for another aspect, the present invention may also be considered as an electronic circuit board. The electronic circuit board comprises first and second main faces that face each other; a connector located on the first main face and enabled to connect an external device; and a flexible sheet located on the face of the electronic circuit board. Part of the flexible sheet is connected to the electronic circuit board and another part thereof is extended so as to be separated from the second main face. When an electronic circuit is mounted on this electronic circuit board, at least part of the electronic circuit can be covered by the flexible sheet.

BRIEF DESCRIPTION OF THE DRAWINGS

Other aspects, features, and advantages of the present invention will become more fully apparent from the following detailed description, the appended claims, and the accompanying drawings in which:

FIG. 1 is a hardware block diagram of a computer system in an embodiment of the present invention;

FIGS. 2A and 2B are an expanded view of a CDC; FIG. 2A is a top view from the face and FIG. 2B is a top view from the back;

FIG. 3 is a perspective view of the CDC that is not covered by an insulating film;

FIG. 4 is a top view of the insulating film;

FIG. 5 is an expanded cross sectional view of the CDC connected to its mother board;

FIG. 6 is a perspective view of the CDC of which projection is taken by fingers;

FIG. 7 is a top view of the projection formed position;

FIG. 8 is a top view of the CDC in another embodiment;

FIG. 9 is a perspective view of the CDC in still another embodiment; and,

FIG. 10 is a perspective view of the CDC in still another embodiment.

DETAILED DESCRIPTION

The use of figure reference labels in the claims is intended to identify one or more possible embodiments of the claimed subject matter in order to facilitate the interpretation of the claims. Such labeling is not to be construed as necessarily limiting the scope of those claims to the embodiments shown in the corresponding figures. The preferred embodiments of the present invention and its advantages are best understood by referring to the drawings, like numerals being used for like and corresponding parts of the various drawings.

Hereunder, the preferred embodiments of the present invention will be described in detail with reference to the accompanying drawings.

FIG. 1 shows a hardware block diagram of a computer system (computer apparatus) 10 in a first embodiment of the present invention. The computer apparatus provided with this computer system 10 is configured as a lap-top PC (Personal Computer) conforming, for example, to the OADG (Open Architecture Developer's Group) specifications and employs a predetermined OS (Operating System).

The computer system 10 shown in FIG. 1 is composed of a CPU (Central Processing Unit) 11 mounted on the mother board; a CPU bridge 15; an I/O bridge 21; a main memory 16; a PCI (Peripheral Component Interconnect) bus 20 used to connect various components; an ISA (Industry Standard Architecture) bus 40; and an FSB (Front Side Bus) 12. The mother board is provided with connectors and slots used to connect such expansion boards as a PC card 24; a mini-PCI device 60; a daughter card 70 provided with functions for communications with external (hereinafter, to be described as the Communication Daughter Card (CDC)), etc., thereby the computer system 10 comes to have various additional functions. Hereunder, the configuration of the computer system 10 will be described concretely.

In the computer system 10 shown in FIG. 1, the CPU 11 mounted on the mother board functions as the brain of the whole computer system 10 and executes various programs under the control of the OS. The CPU 11 is connected to each component of the computer system 10 via three steps of busses as the system bus FSB 12, the PCI bus 20 used for fast I/O devices, and the ISA bus 40 used for slow I/O devices. The CPU 11 stores program codes and data in a cache memory so as to process them fast. In recent years, an SRAM of about 128 KB is often provided in the CPU 11 as a primary cache. In addition, for a secondary cache 14, about 512K to 2 MB is spared in the CPU 11 and used via a dedicated bus BSB (Back Side Bus) 13. The BSB 13 may be omitted and the secondary cache 14 may be connected to the FSB 12.

The FSB 12 and the PCI bus 20 are connected to each other via a CPU bridge (host-PCI bridge) 15 referred to as a memory/PCI chip. This CPU bridge 15 is configured so as to have memory controller functions for controlling the accesses to the main memory 16, a data buffer for absorbing the data transfer speed difference to generate between the FSB 12 and the PCI bus 20, as well as others.

The main memory 16 is used as an area for reading programs to be executed by the CPU 11 or as an area for writing data processed by those programs. For example, the main memory 16 is configured by a plurality of DRAM chips and it can be expanded as needed. The programs to be executed by the CPU 11 include various hardware drivers used to operate the OS, as well as various peripheral devices, application programs dedicated to specific business works, and such firmware programs as the BIOS (Basic Input/Output System) stored in a flash ROM 44 to be described later, etc.

The video subsystem 17 is used to execute video-related functions. The video subsystem 17 includes a video controller. This video controller processes drawing instructions received from the CPU 11 and writes processed drawing information in a video memory and reads the drawing information from the video memory so as to output the information onto the liquid crystal display (LCD) 18 as drawing data.

The PCI bus 20 enables data to be transferred comparatively fast. The PCI bus 20 is standardized so that the data bus width is set to 32/64 bits, the maximum operation frequency is set to 33/66 MHz, and the maximum data transfer speed is set to 132 MB/sec/528 MB/sec respectively. The I/O bridge (core bridge) 21, the card bus controller 22, the audio subsystem 25, the docking station interface (Dock I/F) 26, and the mini-PCI connector (expansion board connector) 27 are connected to this PCI bus 20 respectively.

The card bus controller 22 is used exclusively to connect the bus signal of the PCI bus 20 directly to the interface connector (card bus) of the card bus slot 23. The PC card 24 can be connected to this card bus slot 23. This PC card 24 is a kind of a device for expanding the capability of the computer system 10. The PC card 24 enables a device to be connected to the dedicated card bus slot 23 from outside without exposing the computer system 10.

The docking station interface (Dock I/F) 26 is a hardware component used to connect a docking station (not shown), which is a capability expansion device of the computer system 10. When a lap-top PC is set at the docking station, various hardware components connected to the internal bus of the docking station can be connected to the PCI bus 20 via the docking station interface 26.

The mini-PCI device 60 is connected to the mini-PCI connector 27. The mini-PCI device 60 is an expandable capability expansion card (board) conforming to the mini-PCI specifications. The "mini-PCI" means a mobile PCI standard; it is described as a supplement to the PCI Rev. 2.2 specification. Functionally, the mini-PCI is equivalent to the full specification PCI. In addition, the mini-PCI connector 27 connects an AC '97 (Audio CODEC '97) link extended from the I/O bridge. The AC '97 link is one of the specifications of sound devices and modem devices for the PCI bus. Usually, the AC '97 link has two channels. One of the two channels is assigned to a sound device and the other is assigned to a modem device.

The I/O bridge 21 is provided with a bridging function for the bridging between the PCI bus 20 and the ISA bus 40. The I/O bridge 21 is also provided with the DMA controller function, the programmable interruption controller (PIC) function, the programmable interval timer (PIT) function, the IDE (Integrated Device Electronics) interface function, the USB (Universal Serial Bus) function, and the SMB (System Management Bus) interface function. The I/O bridge 21 also incorporates a real time clock (RTC) in itself.

The DMA controller function enables data transfer between such peripheral devices as an FDD, etc. and the main memory 16 not via the CPU 11. The PIC function enables a predetermined program (interruption handler) to be executed in response to an interruption request (IRQ) from each of the peripheral devices. The PIT function generates timer signals at predetermined cycles. Each interface realized by the IDE interface function is connected to an IDE hard disk drive (HDD) 31, as well as a CD-ROM drive 32 via an ATAPI (AT Attachment Packet Interface). Instead of this CD-ROM drive 32, another type IDE device such as a DVD (Digital Versatile Disk) drive may be connected to the interface. Such external storage devices as the HDD 31, the CD-ROM drive 32, etc. are housed in a place in the subject lap-top PC. The place is usually referred to as a "media bay" or "device bay". Those external storage devices attached to the PC as standard might possibly be replaceable with such other devices as an FDD, a battery pack or attached exclusively.

The I/O bridge 21 is also provided with a USB port. The USB port is connected to a USB connector 30 located, for example, on a wall of the lap-top PC body. In addition, an EEPROM 33 is connected to this I/O bridge 21 via the SM bus. This EEPROM 33 is a non-volatile memory used to hold information such as a user-registered password, a supervisor password, the product serial number, etc. The data in the EEPROM 33 can thus be rewritten electrically. The I/O bridge 21 is also connected to a power supply circuit 50. The power supply circuit 50 is provided with an AC adapter 51; a battery changing circuit 54 used to charge the battery (second battery) (the main battery 52 or second battery 53) and change the power supply path from the AC adapter 51/each battery; a DC/DC converter 55 used to generate such DC constant voltages as 5V, 3.3V, etc. used for the computer system 10.

The I/O bridge 21 is also connected to a CDC connector 28 used to connect a CDC. This CDC connector 28 is connected to a CDC (expansion board, communication expansion board) 70. The CDC 70 is a capability expansion daughter board dedicated for communications with external. In this embodiment, the CDC 70 is used as a LAN board conforming to the Ethernet standard (hereinafter, to be described as a LAN CDC provided with the LAN function). Signals are exchanged between the CDC connector 28 and the I/O bridge 21 in accordance with the Ethernet interface standard. Concretely, the LAN interface converts analog signals received from the CDC 70 to digital signals through the PHY (Physical Layer) and the digital signals are converted and processed by a MAC (Media Access Controller) in accordance with the Ethernet protocol. The CDC 70 is smaller than the mini-PCI device 60 in size. For example, the CDC 70 has an area of about ½.5 of the mini-PCI device 60.

In addition to the LAN interface, AC '97 link and USB (Universal Serial Bus) interfaces are provided between the I/O bridge 21 and the CDC connector 28. Consequently, in addition to the Ethernet standard LAN board, the CDC connector 28 can connect a CDC 70 provided with the modem board function conforming to the AC '97 link specifications (hereinafter, to be described as a modem CDC) or such a CDC 70 as a USB (Universal Serial Bus) standard wireless LAN board, etc. (hereinafter, to be described as a LAN CDC).

The ISA bus 40 is slower than the PCI bus 20 in data transfer rate (for example, bus width: 16 bits, maximum data transfer rate: 4 MB/sec). This ISA bus 40 is connected to the embedded controller 41 connected to the gate array logic 42; the CMOS 43; the flash ROM 44; and the super I/O controller 45 respectively. This ISA bus 40 can also be connected to such peripheral devices as a keyboard/mouse controller, which are comparatively slow in operation. The super I/O controller 45 is connected to the I/O port 46 and used to drive an FDD and control the input/output of parallel data (PIO) via a parallel port and the input/output of serial data (SIO) via a serial port. The embedded controller 41 controls a keyboard (not shown) and some of the power management functions.

Next, for a particular aspect, the configuration of the CDC 70 is described.

FIG. 2 is an expanded view of the CDC 70 shown in FIG. 1. FIG. 2(a) is a top view from the face (second face) and FIG. 2(b) is a top view from the back (first face). FIG. 3 is a perspective view of the CDC 70 that is not covered by the insulating film. FIG. 4 is another top view of the CDC 70 for denoting the shape of the insulating film. FIG. 5 is an expanded cross sectional view of the CDC 70 for denoting how the CDC 70 is connected to the mother board 100.

The CDC 70 is used for a LAN and composed of a board 80 and an insulating film 90 that covers the face of the board 80 as shown in FIG. 2(a). The CDC 70 has two surfaces; the face 80s and the back (on which an IC is mounted) 80t that are faced each other. The approximate size of the CDC 70 is 45 mm (x direction: length) 28 mm (y direction: width) for example. As shown in FIGS. 3 and 5, the board 80 is composed of a connector part 81 used to connect the CDC connector 28 on the mother board 100; holes 85a and 85b used to fix the board 80 onto the mother board 100 with screws; and an I/O connector part 82 used to connect a modular connector RJ-45 used to connect an external network. Those items of the CDC 70 are all located on the back 80t. In FIG. 3, the detailed description of the circuits on the back 80t of the board 80 is omitted. The connector part 81 of this CDC 70 is connected to the CDC connector 28 on the mother board 100 while the circuit-mounted side 100t of the mother board 100 faces the back 80t of the CDC 70 as shown in FIG. 5.

In the CDC 70, the primary circuit 88 in which the I/O connector part 82 of the board 80 exists might receive a high voltage caused by lightning from an external network connected thereto via the modular connector RJ-45 while the modular connector RJ-45 is connected to the I/O connector part 82. In order to avoid such a trouble, therefore, the primary area 88 of the board 80 may be covered by the insulating film 90 as shown in FIG. 2. The insulating film 90 is made of, for example, such a flexible sheet as polypropylene sheet or the like. The insulating sheet is preferably within about 0.05 to about 0.1 mm in thickness so as not to increase the total thickness of the CDC 70 body.

In order to cover the board 80 by the insulating film 90 as shown in FIGS. 2A and 2B, for example, the insulating film 90 cut into a shape as shown in FIG. 4 is wound on the board 80 so that both x and y directions are aligned at the primary area 88 of the board 80. The length of the insulating film 90 is enough to go round the board 80 once in the y direction and cover the primary circuit 88 in the x direction. Then, the insulating film 90 is wound on the board 80 so that the rear edge part 90b of the insulating film 90 is almost aligned to the rear edge part 80b of the board 80 and the position of the hole 91 formed in the insulating film 90 is aligned to the position of the hole 85b of the board 80. After this, the side edge parts 90d and 90c of the insulating film 90 wound on the board 80 are put on top of one another and stuck with an adhesive. As a result, the primary area 88 is covered and the secondary area is exposed in the CDC 70 as shown in FIG. 2B. In the secondary area is provided a connector part 81 used to connect the CDC connector 28 located on the mother board 100.

At this time, the insulating film 90 has a projection 95 protruded outside the front edge part 90a in the x direction. In the CDC 70, this projection 95 is located on the face 80s of the board 80 as shown in FIG. 2A. The user can take this projection 95 with fingers as shown in FIG. 6 so as to connect/disconnect the CDC 70 to the CDC connector 27 of the mother board 100 and carry the CDC 70 with him/her.

Hereinafter, the shape of the projection 95 is further described. The dimensions of the projection 95 are, for example, 12 mm (95w (width of the fixed end))×9 mm (95d (length from the fixed end to the free end). When the insulating film 90 is wound on the board 80, the distance d between the tip of the projection 95 and the front end of the board 80 is 1 mm. To make it easier to take the projection with fingers, the width 95w of the projection 95 is preferably 7 mm or over, further preferably be 10 mm or over. On the other hand, the length 95d of the projection 95 is preferably 7 mm or over so as to make it easier to take the portion with fingers. While the upper limits of both width 95w and length 95d are not limited specially, the width 95w and the length 95d is preferably 30 mm or less and 35 mm or less respectively so that the projection 95 is not become an obstacle when the CDC 70 is installed in a computer system 10.

The projection 95 shaped as described above is positioned so as to make it easier to apply a force to the connector part 81 on the back 80t, so that the CDC 70 connected to the CDC connector 28 of the mother board 100 as shown in FIG. 5 is disconnected easily from the mother board 100 upward by taking the projection 95 of the CDC 70 with fingers as shown in FIG. 6. Concretely, the point of the force should preferably comes to the center of the connector part 81 when the projection 95 is pulled up.

In this embodiment, the vertical center line 96n that divides the projection 95 into two parts in the y direction is aligned to the vertical center line 81n that divides the connector part 81 into two parts in the y direction. The distance between the horizontal center line 81m that divides the connector part 81 into two parts in the x direction and the base end 96 of the projection 95 is set to about 5 mm. Because the base end 96 of the projection 95 is positioned around the connector part 81, it is easy to disconnect the CDC 70 from the CDC connector 27 of the mother board 100.

Furthermore, to make it easier to disconnect the CDC 70 from the CDC connector 27 of the mother board 100, the base end center 96c that divides the base end 96 of the projection 95 into two parts in the y direction is preferably positioned in an installation area 87 shown in FIG. 7. The installation area 87 has a predetermined distance in the y and x directions from the center 81c of the connector, which is a node of the vertical center line 81n and the horizontal center line 81m of the connector part 81. The predetermined distance on the face 80s is preferably within 10 mm from a position corresponding to the connector center 81c. Furthermore, each of the distances 87a and 87b in the y direction is preferably 5 mm or under. The distance 87d between the connector center 81c and the front end 80f of the board 80 in the x direction is preferably 4 mm or under (the distance between the connector center 81c and the front end 80f of the board 80) and the distance 87c between the connector center 81c and the rear end 80e of the board 80 in the x direction is preferably 10 mm or under.

In the case of the insulating film 90, corners 94a and 94b that are boundaries between the front edge part 90a and the projection 95 thereof are curved. Because the corners 94a and 94b are curved such way, when an attempt is made to disconnect the CDC 70 from the mother board 100 by taking the projection 95 with fingers as shown in FIG. 6 while the CDC 70 is connected to the CDC connector 28, a force applied to the corners 94a and 94b of the insulating film 90 is not concentrated at a point so much. This is why the endurance of both corners 94a and 94b of the insulating film 90 is improved. Consequently, when the projection 95 is pulled with fingers, the insulating film 90 is prevented from being lengthened and cut off at the corner 94a/94b. The curvature R of the curved corners 94a and 94b is preferably 5 to 8 mm or so.

The shape of the corners 94a and 94b may be changed. For example, just like the corners 94c and 94d of the CDC 70A shown in FIG. 8, each of the corners 94a and 94b may be formed obliquely towards the projection 95a from the front edge 90a of the insulating film 90A. The shape may also be right-angled. Such the insulating film 90A may be made of a sheet strong enough so as not to be cut off when the CDC 70A connected to the CDC connector 28 is pulled off by taking the projection 95a with fingers.

The connector part 81 of the CDC 70 is connected to the CDC connector part 28 of the mother board 100 such way. On the other hand, the connector part of a flexible cable (not shown) is connected to the I/O connector part 82 of the CDC 70. The other end of the flexible cable is connected to the modular connector RJ-45 so as to be connected to an external network.

When the computer system 10 is powered by the user in this state, an ID signal is output from the mother board connector part 81 of the CDC 70 via an output pin of the GPIO (General Purpose Input/Output) pins to an input pin of the I/O bridge 21. The ID signal communicates the main memory 16 about that the CDC 70 is a LAN board. The GPIO pins are used to input/output general signals and the GPIO-pin state can be changed freely with use of a software program (CDC driver, etc.). The GPIO is used for communications with other chips. In this embodiment, a specific type CDC is assigned to each of the GPIO pins. Consequently, an ID signal issued when the CDC 70 is connected turns off a predetermined pin assigned to the LAN board ID signal beforehand at the input side of the GPIO of the I/O bridge 21. Then, the mother board (host) 100 outputs information that the CDC 70 connected to the CDC connector 28 is identified as a LAN board to the main memory 16 via the I/O bridge 21.

As a result, the computer system 10 recognizes the CDC 70 as a device that functions as a LAN board, thereby executing processings appropriately to the CDC 70 used as a LAN board.

As described above, the CDC 70 connected to the mother board 100 as shown in FIG. 5 enables the computer system 10 to make communications via the LAN (CDC 70). In this case, because the CDC 70 has the projection 95 formed with the insulating film 90, the user can adjust the position of the CDC 70 to the CDC connector 27 easily by taking the projection 95 with fingers, thereby the user can connect the CDC 70 to the mother board 100 easily. When disconnecting the CDC 70 from the CDC connector 27 of the mother board 100, the user can also do the work easily by pulling the projection 95. Consequently, the use of the CDC 70 will make it easier to expand the functions of the computer system 10 and replace the functions of the computer system 10 with others easily.

Furthermore, because the projection 95 is formed by extending the insulating film 90 in the above embodiment, the manufacturing cost can be reduced more than that of any of the conventional insulating films that are not provided with any projection. In addition, such the projection 95 can be formed easily in the above embodiment.

FIG. 9 is a perspective view of another CDC provided with another shaped projection in another embodiment of the present invention.

In the CDC 70B shown in FIG. 9, a projection film 98 is wound outside the insulating film 90B that covers the board 80. The insulating film 90B is not provided with the projection 95, which is formed at the insulating film 90 in the CDC 70 shown in FIG. 2(*a*). Around the front edge 90*a* of this insulating film 90B is wound the projection film 98. Both films 90B and 98 are stuck at mutual contact portions by an adhesive so as to form a projection 98*t*. In this case, both films 98 and 90B may be stuck all over or partially at those mutual contact portions. The projection 98*t* is made of the same insulating sheet material as that of the insulating film 90B. They may also be made of different materials.

The projection 98*t*, because it is protruded outside from the back 80*t* of the board 80, is easy for the user to take with fingers. The height 98*d* of the projection formed on the face of the insulating film 90B is about 8 mm and the width 98*w* of the insulating film 90B is about 14 mm. Just like the CDC 70, the base end 98*b* of the projection 98*t* is preferably positioned around a portion corresponding to the center of the connector part 81 (not shown in FIG. 9) formed on the back 80*t* even for this CDC 70B.

As described above, the projection 98*t* may also be formed with a material different from that of the insulating film 90B for insulating the board 80. Such way, the insulating film enables the projection 98*t* to be shaped and positioned freely when the projection 98*t* is formed with a non-continuous material. Consequently, the projection 98*t* can be positioned so as to make it easier for the user to take and easier for a disconnecting force to work on the connector part 81. This is why the user can disconnect the CDC 70B from the CDC connector 27 of the mother board 100.

While the CDC 70 has been described as a LAN CDC in the above embodiment, the insulating film 90 may also apply to a modem CDC employed as the CDC 70. While the insulating film 90 is wound on the board 80 just once in the LAN CDC 70, it may be wound twice. Especially, when the CDC 70 is used as a modem CDC, the insulating film 90 should be wound more than twice so as to assure the insulation.

FIG. 10 is a perspective view of still another CDC in still another embodiment of the present invention. The CDC is provided with a projection whose shape differs from those in the above embodiments.

The CDC 70C shown in FIG. 10 is a wireless LAN CDC. In this case, unlike the LAN CDC and the modem CDC that must be insulated, there is no need to insulate the CDC. The surface of the wireless LAN CDC is thus covered by no insulating film. And, a projection 95*c* is formed with a fixed tape 99 on the board 80 as shown in FIG. 10. At this time, the fixed tape 99 is preferably positioned on the board 80 where no such components as circuits are placed. And, because the fixed tape 99 requires only a very small area, the fixed tape 99 is preferably such a strong double-sided adhesive tape or the like. On the other hand, the sheet that forms the projection 95*c* is preferably a low stiffness one difficult to be cut off at the base end 96. Preferably, the sheet that forms the projection 95*c* should be a flexible sheet made of the same material as that of, for example, the insulating film 90 used for the CDC 70.

Because the base end 96 is fixed to the surface of the board even at the CDC 70C that requires no insulating film in this embodiment as described above, the projection 95*c* can be formed easily. The user can thus take the projection 95*c* of the CDC 70C so as to connect/disconnect the CDC 70C to/from the CDC connector 27 of the mother board 100 easily.

It is also possible to form the projection at the above-described wireless LAN CDC by covering both face and back of the CDC just like the LAN CDC.

While the computer system 10 in this embodiment is provided with only one CDC connector 27 that connects the CDC 70/70A/70B/70C, the present invention can apply to a computer system provided with a plurality of CDC connectors used to connect a plurality of CDCs.

While a description has been made only for the CDC in this embodiment, the present invention can apply to such expansion boards as the mini-PCI device, the MDC, etc. The functions of the expansion board of the present invention, to be added to the computer system 10, are not limited only to functions of communications with external; the functions may be those of video cards, memories, etc.

In addition to those described above, obviously many more modifications and variations of the present invention are possible without departing from the spirit of the present invention.

What is claimed is:

1. An expansion board for operative connection with a motherboard of a communication device having a processor, said expansion board comprising: a primary area, a posterior area, wherein said primary area is opposite that of said posterior area, electronic components and circuitry, an insulating adhesive film of a predetermined form wound and adhered around said expansion board forming an integral protruding lip having a fixed end and a free end extending over said primary area, wherein said integral protruding lip is suitable for handling by two fingers of a user's hand, and a connector operatively and fixedly connected with said posterior area for connection to a communication interface.

2. The system of claim 1, wherein said connector is adapted to removably receive a motherboard.

3. The system of claim 1, wherein said communication interface includes a communication channel used to communicate with an external network such as: a modem channel, a LAN channel or a wireless LAN channel.

4. The system of claim 1, wherein said protruding lip is at least 7 mm in length.

5. The system of claim 1, wherein said insulating adhesive film encompasses at least said electronic components and circuitry of said expansion board.

6. The system of claim 5, wherein said insulating adhesive film is shaped to form a protruding lip that extends at least 1 mm beyond an edge of said primary area.

* * * * *